(12) United States Patent
Hu (10) Patent No.: US 10,204,923 B2
(45) Date of Patent: *Feb. 12, 2019

(54) THIN-FILM-TRANSISTOR (TFT) ARRAY PANEL WITH STRESS ELIMINATION LAYER AND METHOD OF MANUFACTURING THE SAME

(71) Applicants: Shenzhen China Star Optoelectronics Technology Co., Ltd., Shenzhen (CN); Wuhan China Star Optoelectronics Technology Co., Ltd., Wuhan (CN)

(72) Inventor: Guoren Hu, Shenzhen (CN)

(73) Assignees: Shenzhen China Star Optoelectronics Technology Co., Ltd., Shenzhen (CN); Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/937,866

(22) Filed: Mar. 28, 2018

(65) Prior Publication Data

US 2018/0219027 A1 Aug. 2, 2018

Related U.S. Application Data

(63) Continuation of application No. 14/904,954, filed as application No. PCT/CN2015/095418 on Nov. 24, 2015.

(30) Foreign Application Priority Data

Nov. 20, 2015 (CN) .......................... 2015 1 0809036

(51) Int. Cl.
*H01L 27/12* (2006.01)
*G02F 1/1362* (2006.01)
(Continued)

(52) U.S. Cl.
CPC ........ *H01L 27/1218* (2013.01); *G02F 1/1362* (2013.01); *G02F 1/133305* (2013.01);
(Continued)

(58) Field of Classification Search
CPC ............. H01L 27/1218; H01L 27/1288; H01L 27/3272; H01L 51/52; G02F 1/1362; G02F 1/133305
See application file for complete search history.

(56) References Cited

U.S. PATENT DOCUMENTS 7,787,097 B2 8/2010 Satoh
2003/0213956 A1 11/2003 Hioki et al.
(Continued)

FOREIGN PATENT DOCUMENTS

CN 101133434 2/2008
CN 104103648 10/2014

OTHER PUBLICATIONS

Official Action dated Jun. 13, 2017 From the US Patent and Trademark Office Re. U.S. Appl. No. 14/904,954. (15 pages).
(Continued)

*Primary Examiner* — John P. Dulka (57) ABSTRACT

The present invention provides a thin-film-transistor (TFT) array panel and manufacturing method of the same. The TFT array panel comprises a flexible baseplate, a buffer layer, and a display-element layer. The buffer layer is disposed on the flexible baseplate, a stress-elimination portion is disposed on the buffer layer, the stress-elimination portion is used to eliminate a stress of the flexible baseplate; the display-element layer is disposed on the buffer layer. The present invention is able to decrease the stress of the flexible baseplate, to prevent too large of a stress of the flexible baseplate.

6 Claims, 7 Drawing Sheets

(51) Int. Cl.
*H01L 27/32* (2006.01)
*H01L 51/52* (2006.01)
*G02F 1/1333* (2006.01)

(52) U.S. Cl.
CPC ...... *H01L 27/1288* (2013.01); *H01L 27/3272* (2013.01); *H01L 51/52* (2013.01); *G02F 2201/07* (2013.01); *H01L 2227/323* (2013.01); *H01L 2251/5338* (2013.01)

(56) References Cited

U.S. PATENT DOCUMENTS

2012/0293760 A1* 11/2012 Masuda .............. H01L 27/1218
349/138
2014/0218630 A1   8/2014 Kang
2015/0313004 A1  10/2015 Namkung et al.
2016/0029473 A1   1/2016 Zang et al.
2017/0148822 A1   5/2017 Hu

OTHER PUBLICATIONS

Official Action dated Dec. 15, 2016 From the US Patent and Trademark Office Re. U.S. Appl. No. 14/904,954. (18 pages).
Official Action dated Dec. 22, 2017 From the US Patent and Trademark Office Re. U.S. Appl. No. 14/904,954. (13 pages).

* cited by examiner

THIN-FILM-TRANSISTOR (TFT) ARRAY PANEL WITH STRESS ELIMINATION LAYER AND METHOD OF MANUFACTURING THE SAME

RELATED APPLICATIONS

This application is a continuation application of U.S. patent application Ser. No. 14/904,954 filed on Jan. 14, 2016, which is a National Phase of PCT Patent Application No. PCT/CN2015/095418 having International filing date of Nov. 24, 2015, which claims the benefit of priority of Chinese Patent Application No. 201510809036.9 filed on Nov. 20, 2015. The contents of the above applications are all incorporated by reference as if fully set forth herein in their entirety.

FIELD AND BACKGROUND OF THE INVENTION

The present invention relates to the field of display driving technology, and more particularly to a thin-film-transistor (TFT) array panel and method of manufacturing the same.

Conventional flexible displays generally comprise flexible baseplates, the flexible baseplates are generally too thin to perform corresponding processes directly on themselves, and hence, generally, the conventional flexible displays need to be fixed on glass baseplates, in order to perform the corresponding processes.

In practice, the inventor has found that the conventional art at least the following problems:

Because expansion coefficients of the glass baseplate and the flexible baseplate are different, there will be a warpage/bending phenomenon of glass substrate during the manufacturing process of the flexible substrate, which is not beneficial to the manufacturing process of the flexible substrate.

So there is a need to provide a new technical proposal to solve the technical problem existing in the conventional art.

SUMMARY OF THE INVENTION

An objective of the present invention is to provide a thin-film-transistor (TFT) array panel and manufacturing method of the same which is able to decrease (slow down) the stress of the flexible baseplate, to prevent too of a large stress on the flexible baseplate.

To solve the above problem, the present invention provides technical proposals as follows:

The present invention provides a TFT array panel, the TFT array panel comprises: a flexible baseplate and a buffer layer. The buffer layer is disposed on the flexible baseplate. A stress-elimination portion is disposed on the buffer layer. The stress-elimination portion is used to eliminate a stress of the flexible baseplate. A display-element layer is disposed on the buffer layer. The stress-elimination portion comprises at least one cave portion and/or protrusion portion, which are lined up as a one dimensional array or a two dimensional array; or the stress-elimination portion comprises at least one notch and/or rib, which are lined up as a one dimensional array or a two dimensional array.

In the TFT array panel of mentioned above, the stress-elimination portion is formed by a photo-mask process and/or an etching process, the stress-elimination portion is disposed on a plane of the buffer layer, the plane is facing the display-element layer; or the stress-elimination portion is formed by coating a photo-resist material on the flexible baseplate and patterning the photo-resist material, to derive photo-resist blocks with a size, a shape, and an area all corresponding with a to-be-formed stress-elimination portion, then forming a material layer which the buffer layer is corresponding with, on the photo-resist block and the flexible baseplate, finally cleaning the photo-resist block, the stress-elimination portion is disposed on a plane of the buffer layer, the plane is facing away from the display-element layer.

A TFT array panel, the TFT array panel comprises: a flexible baseplate; a buffer layer is disposed on the flexible baseplate, a stress-elimination portion is disposed on the buffer layer, the stress-elimination portion is used to eliminate a stress on the flexible baseplate; a display-element layer is disposed on the buffer layer.

In the TFT array panel of mentioned above, the TFT array panel further comprises: a first shielding layer is disposed on the flexible baseplate, and is disposed beneath the buffer layer.

In the TFT array panel of mentioned above, the display-element layer comprises a second shielding layer and a display-unit layer. The second shielding layer is disposed on the buffer layer and overlaps the buffer layer. The display-unit layer is disposed on the second shielding layer.

In the TFT array panel of mentioned above, the stress-elimination portion comprises at least one cave portion and/or protrusion portion, which are lined up as a one dimensional array or a two dimensional array.

In the TFT array panel of mentioned above, the second shielding layer fills at least one of the cave portion and intervals between each two of the protrusions.

In the TFT array panel of mentioned above, the stress-elimination portion comprises at least one notch and/or rib, which are lined up as a one dimensional array or a two dimensional array.

In the TFT array panel of mentioned above, the second shielding layer fills at least one of the notch and intervals between each two of the ribs.

In the TFT array panel of mentioned above, the stress-elimination portion is formed by a photo-mask process and/or an etching process; the stress-elimination portion is disposed on a plane of the buffer layer, the plane is facing the display-element layer.

In the TFT array panel of mentioned above, the stress-elimination portion is formed by disposing a photo-resist material on the flexible baseplate and patterning the photo-resist material, to derive photo-resist blocks with a size, a shape, and an area all corresponding with a to-be-formed stress-elimination portion, then forming a material layer which the buffer layer is corresponding with, on the photo-resist block and the flexible baseplate, finally cleaning the photo-resist block; the stress-elimination portion is disposed on a plane of the buffer layer, the plane is facing away from the display-element layer.

A manufacturing method for the TFT array panel of mentioned above, the method comprises below steps: A. disposing the buffer layer on the flexible baseplate; B. disposing the stress-elimination portion on the buffer layer, wherein the stress-elimination portion is used to eliminate a stress of the flexible baseplate; C. disposing the display-element layer on the buffer layer.

In the manufacturing method for the TFT array panel of mentioned above, a first shielding layer is disposed between the flexible baseplate and the buffer layer.

In the manufacturing method for the TFT array panel of mentioned above, the display-element layer comprises a second shielding layer and a display-unit layer, the second shielding layer is disposed on the buffer layer, the second shielding layer overlaps the buffer layer, the display-unit layer is disposed on the second shielding layer.

In the manufacturing method for the TFT array panel of mentioned above, the stress-elimination portion comprises at least one cave portion and/or protrusion portion; the at least one cave portion and/or protrusion portion which are lined up as a one dimensional array or a two dimensional array.

In the manufacturing method for the TFT array panel of mentioned above, the second shielding layer fills at least one of the cave portion and intervals between each two of the protrusions.

In the manufacturing method for the TFT array panel of mentioned above, the stress-elimination portion comprises at least one notch and/or rib; the at least one notch and/or rib which are lined up as a one dimensional array or a two dimensional array.

In the manufacturing method for the TFT array panel of mentioned above, the second shielding layer fills at least one of the notch and intervals between each two of the ribs.

In the manufacturing method for the TFT array panel of mentioned above, the step B comprises: b1. Performing photo-mask process and/or etching process on the buffer layer, to form the stress-elimination portion; the stress-elimination portion is disposed on a plane of the buffer layer, the plane is facing the display-element layer.

In the manufacturing method for the TFT array panel of mentioned above, the step B comprises: b2. coating a photo-resist material on the flexible baseplate; b3. patterning the photo-resist material, to derive photo-resist blocks with a size, a shape, and an area all corresponding with a to-be-formed stress-elimination portion; b4. forming a material layer which the buffer layer is corresponding with, on the photo-resist block and the flexible baseplate; b5. cleaning the photo-resist block; the stress-elimination portion is disposed on a plane of the buffer layer, the plane is facing away from to the display-element layer.

With comparison with the conventional art, the present invention is able to decrease (slow down) the stress of the flexible baseplate, to prevent too large of a stress on the flexible baseplate, then preventing warpage/bending phenomenon of the glass substrate or the glass substrate used for making the flexible baseplate, which is beneficial to increase the precision level of lithography-position process.

To make the above present invention more clearly comprehensible, preferred embodiments, along with the accompanying drawings, are detailed below:

DESCRIPTION OF SPECIFIC EMBODIMENTS OF THE INVENTION

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The display panel of the present invention can be a TFT-LCD, an active matrix organic light emitting diode (AMOLED), and an organic emitting luminance panel.

Figure 1:
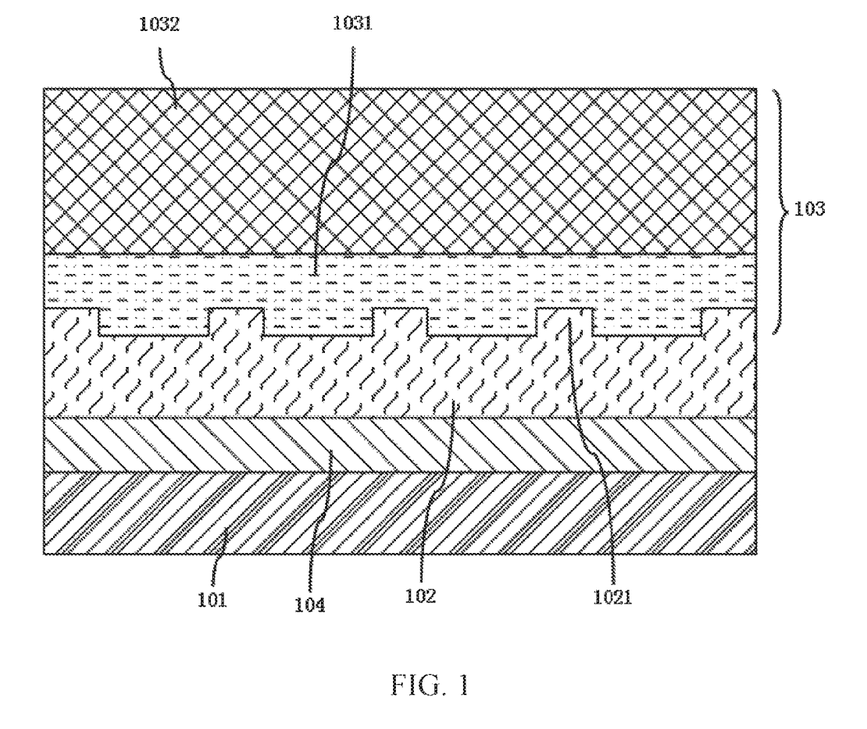
FIG. 1 is an illustrative drawing of a first preferred embodiment of a TFT array panel according to the present invention.
Figure 2:
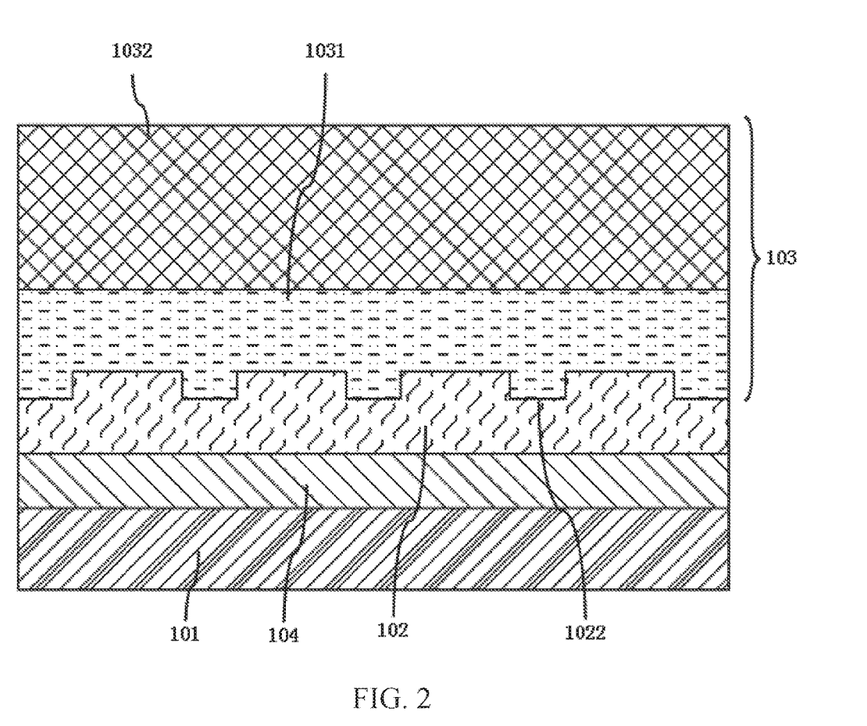
FIG. 2 is an illustrative drawing of a second preferred embodiment of a TFT array panel according to the present invention.
Figure 3:
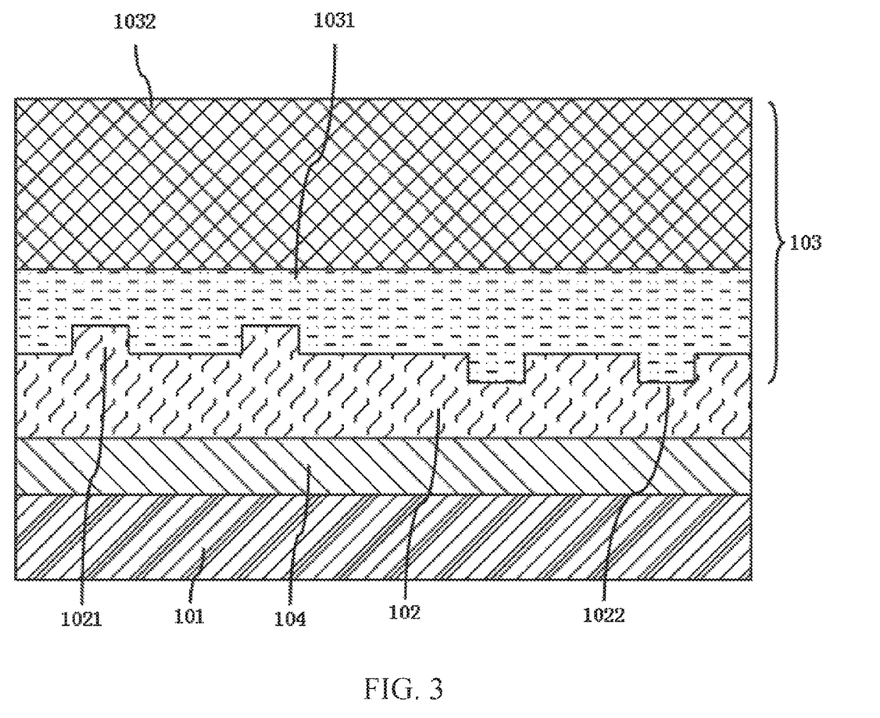
FIG. 3 is an illustrative drawing of a third preferred embodiment of a TFT array panel according to the present invention.

Refer to FIGS. 1-7. FIG. 1 is an illustrative drawing of a first preferred embodiment of a TFT array panel according to the present invention. FIG. 2 is an illustrative drawing of a second preferred embodiment of a TFT array panel according to the present invention. FIG. 3 is an illustrative drawing of a third preferred embodiment of a TFT array panel according to the present invention. FIGS. 4-7 are top viewing of different types of the buffer layers 102 according to the TFT array panels of FIGS. 1-3.

The liquid crystal display panel of the present invention comprises a display region and a testing region. The display region is used to perform image display, and comprises a flexible baseplate 101, a first shielding layer 104, a buffer layer 102, and a display-element layer 103.

The first shielding layer 104 is disposed on the flexible baseplate 101, and the buffer layer 102 is disposed on the flexible baseplate 101. Specially, the buffer layer 102 is disposed on the first shielding layer 104, a stress-elimination portion is disposed on the buffer layer 102, and the stress-elimination portion is used to eliminate a stress of the flexible baseplate 101.

The display-element layer 103 is disposed on the buffer layer 102. The display-element layer 103 comprises a second shielding layer 1031 and a display-unit layer 1032, the second shielding layer 1031 is disposed on the buffer layer 102, and the display-unit layer 1032 is disposed on the second shielding layer 1031.

Figure 4:
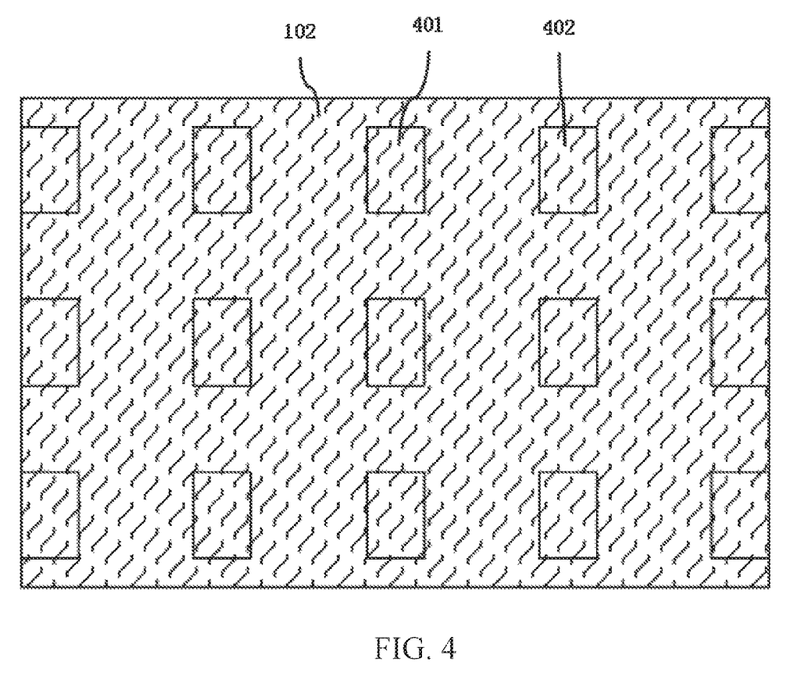
FIGS. 4, 5, 6 and 7 are top viewing of different types of the buffer layers according to the TFT array panels of FIGS. 1, 2 and 3.

The stress-elimination portion comprises at least one cave portion 402 and/or protrusion portion 401. The at least one cave portion 402 and/or protrusion portion 401 which are lined up as a one dimensional array or a two dimensional array, as shown in FIG. 4.

Figure 5:
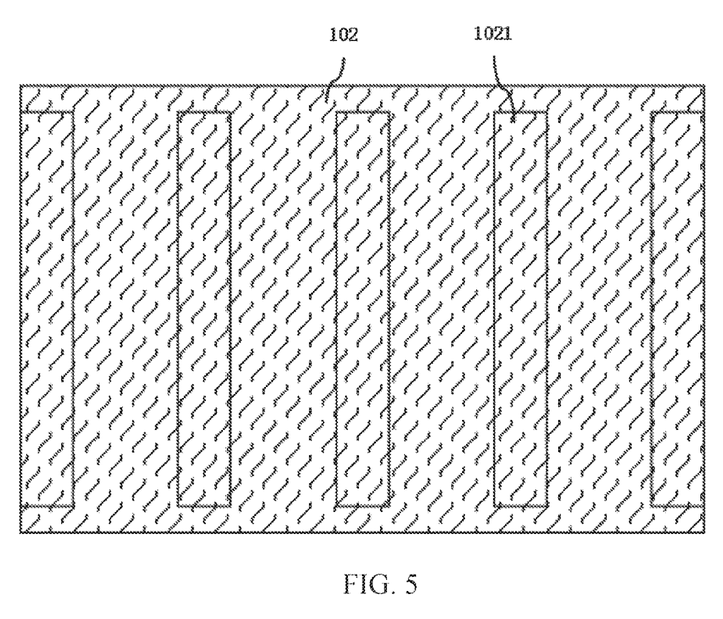
Figure 6:
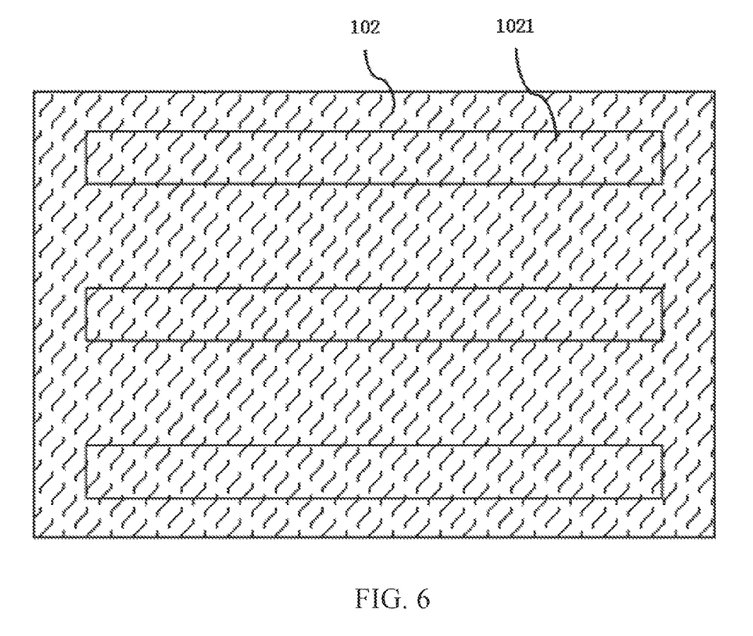
Figure 7:
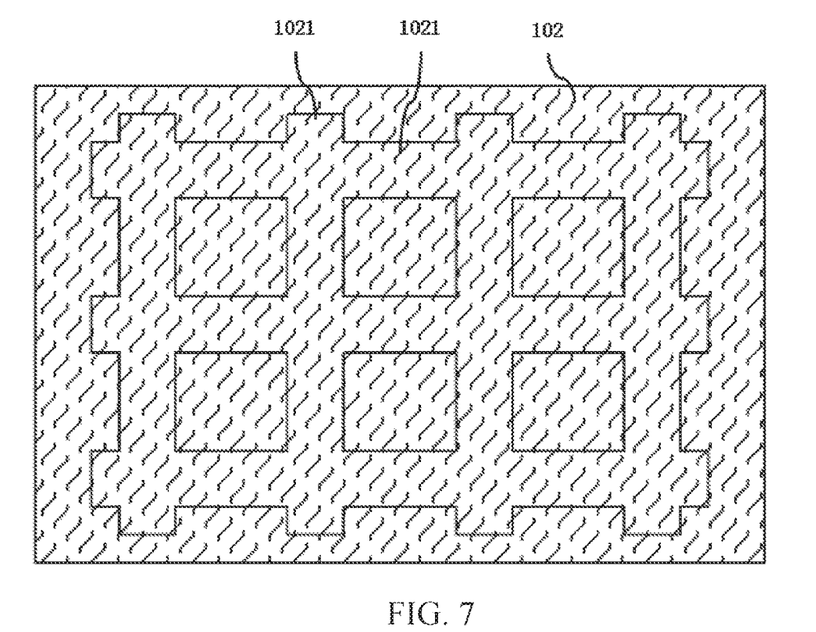

Or, the stress-elimination portion comprises at least one notch 1022 and/or rib 1021, the at least one notch 1022 and/or rib 1021 which are lined up as a one dimensional array or a two dimensional array, as shown in FIGS. 5-7.

In the embodiments, the stress-elimination portion is formed by a photo-mask process and/or an etching process, meanwhile, the stress-elimination portion is disposed on a plane of the buffer layer 102, and the plane is facing the display-element layer 103.

Or, the stress-elimination portion is formed by disposing bottom shielding layer (such as the first shielding layer 104) and the buffer layer 102 (such as SiNx, SiOx . . . ) on the flexible baseplate 101. Then, coating a photo-resist material on the flexible baseplate 101 and patterning the photo-resist material, to derive photo-resist blocks with a size, a shape, and an area all corresponding with a to-be-formed stress-elimination portion. Then, performing an etching process, to derive a material layer (such as SiNx, SiOx . . . ) which the buffer layer 102 is corresponding with. Finally cleaning the photo-resist block (which means to strip the photo-resist block).

Or by a method of sputter lift off, in other words, no etching is used. By disposing the material layer (such as SiNx, SiOx . . . ) on the first whole shielding layer (the first shielding layer 104) with polyimide (PI). Then, coating a photo-resist material on the whole shielding layer (the first shielding layer 104). Then patterning the photo-resist material, and forming a second layer of buffer layer 102 by physical vapor deposition, then removing the photo-resist block to finish the stress-elimination portion.

Meanwhile the stress-elimination portion is disposed on a plane of the buffer layer 102, the plane is facing away from to the display-element layer 103.

The second shielding layer 1031 overlaps the buffer layer 102. The second shielding layer 1031 fills at least one of the cave portion 402, the notch 1022, intervals between each two of the protrusions 401, and intervals between each two of the ribs 1021.

With the technical proposal as mentioned above, the stress of the flexible baseplate 101 is decreased (slowed down), to prevent too large of a stress of the flexible baseplate 101, then preventing warpage/bending phenomenon of the glass substrate or the glass substrate used for making the flexible baseplate 101, which is beneficial to increase the precision level of Lithography-position process.

Figure 8:
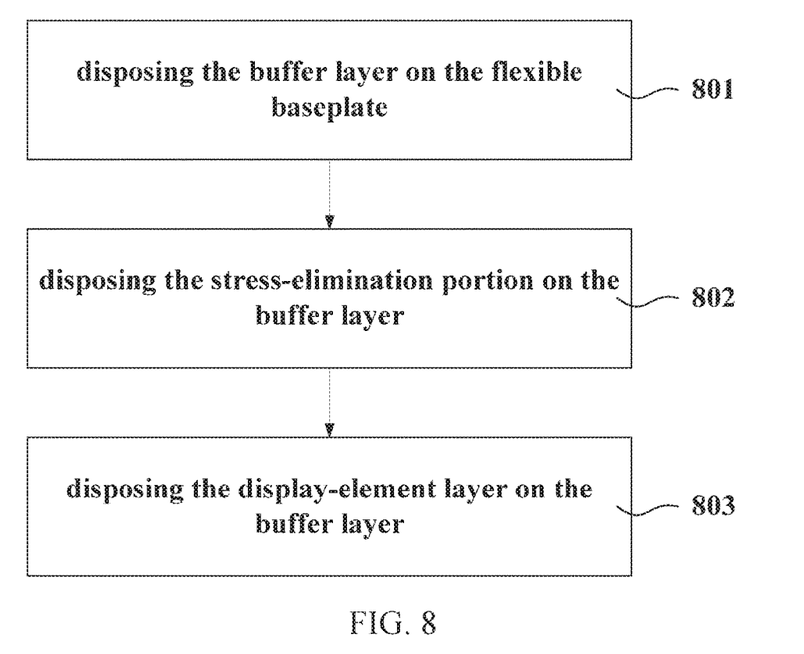
FIG. 8 is a flow chart of a manufacturing method of the TFT array panel of the present invention.

FIG. 8 is a flow chart of a manufacturing method of the TFT array panel of the present invention.

The manufacturing method for the TFT array panel of the present invention comprises below steps:

A. (step 801) disposing the buffer layer 102 on the flexible baseplate 101.

B. (step 802) disposing the stress-elimination portion on the buffer layer 102, where the stress-elimination portion is used to eliminate a stress of the flexible baseplate 101.

C. (step 803) disposing the display-element layer 103 on the buffer layer 102.

The stress-elimination portion comprises at least one cave portion 402 and/or protrusion portion 401, the at least one cave portion 402 and/or protrusion portion 401 which are lined up as one dimension array or two dimensions array. Or, the stress-elimination portion comprises at least one notch 1022 and/or rib 1021, the at least one notch 1022 and/or rib 1021 which are lined up as a one dimensional array or a two dimensional array.

In the preferred embodiment, the step B (the step 802) comprises:

b1. Performing photo-mask process and/or etching process to the buffer layer 102, to form the stress-elimination portion. Meanwhile, the stress-elimination portion is disposed on a plane of the buffer layer 102. The plane is facing the display-element layer 103.

Or the step B (the step 802) comprises:

b2. coating a photo-resist material on the flexible baseplate;

b3. patterning the photo-resist material, to derive photo-resist blocks with a size, a shape, and an area all corresponding with a to-be-formed stress-elimination portion;

b4. forming a material layer which the buffer layer is corresponding with, on the photo-resist block and the flexible baseplate;

b5. cleaning the photo-resist block, in other words, to strip the photo-resist block;

Or, no etching is used, by a method of sputter lift off. By disposing the material layer (such as SiNx and SiOx) on the first whole shielding layer (the first shielding layer 104) with polyimide (PI). Then, coating a photo-resist material on the whole shielding layer (the first shielding layer 104). Then patterning the photo-resist material, and forming a second layer of buffer layer 102 (the second layer of buffer layer can be organic, inorganic, or metal materials) by physical vapor deposition. Then, removing the photo-resist block to finish the stress-elimination portion.

Meanwhile the stress-elimination portion is disposed on a plane of the buffer layer 102. The plane is facing away from to the display-element layer 103.

With the technical proposal as mentioned above, it is able to decrease (slow down) the stress of the flexible baseplate 101, to prevent too large of a stress of the flexible baseplate 101, then preventing warpage/bending phenomenon of the glass substrate or the glass substrate used for making the flexible baseplate 101, which is beneficial to increase the precision level of Lithography-position process.

Despite relative to one or more implementations shown and described the present invention, those skilled in the art based on the specification and drawings of reading and understanding would expect equivalent variations and modifications. Particularly with regard to the various functions of the above components (assemblies, devices, systems, etc.) performed, unless otherwise specified, the terms describe such components (including "means" reference) intended for the implementation of the corresponding Parts specific function (i.e., functionally equivalent) of any part, even though not structurally equivalent to the implementation of the present disclosure illustrated implementations of the disclosed structure functions as well. Further, although a particular feature of the present disclosure may have been illustrated and/or with respect to only been one of several implementations described, but such feature may be combined with one or more other features of the other implementations, which for any given or specific applications may be desirable and advantageous. In addition, in the detailed description and/or claims, the term "comprise", "include", "has", or variant, such a term is intended to contain a similar manner to the term "comprise."

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A TFT array panel, comprising:
a flexible baseplate;
a buffer layer, disposed on the flexible baseplate;
a display-element layer, disposed on the buffer layer;
wherein a stress-elimination portion is disposed on a plane of the buffer layer, and the plane is positioned closer to the display-element layer than a position of one other plane of the buffer layer;
wherein the display-element layer comprises a second shielding layer and a display-unit layer, the second shielding layer is disposed on the buffer layer, the second shielding layer overlaps the buffer layer, and the display-unit layer is disposed on the second shielding layer;
wherein the stress-elimination portion comprises at least one recess and at least one protrusion portion, wherein the at least one recess and the at least one protrusion portion are lined up as a one dimensional array or a two dimensional array.

2. The TFT array panel according to claim 1, further comprising:
a first shielding layer, disposed on the flexible baseplate, and disposed beneath the buffer layer.

3. The TFT array panel according to claim 1, wherein the second shielding layer fills at least one of the recess and intervals between each two of the protrusions.

4. The TFT array panel according to claim 1, wherein the stress-elimination portion comprises at least one notch and/or rib, which are lined up as a one dimensional array or a two dimensional array.

5. The TFT array panel according to claim 4, wherein the second shielding layer fills at least one of the notch and intervals between each two of the ribs.

6. The TFT array panel according to claim 1, wherein the stress-elimination portion is disposed on the other plane of the buffer layer.

* * * * *